(12) United States Patent
Ando

(10) Patent No.: US 9,142,425 B2
(45) Date of Patent: Sep. 22, 2015

(54) METHOD FOR FABRICATING THIN-FILM TRANSISTOR

(71) Applicant: NISSIN ELECTRIC CO., LTD., Kyoto (JP)

(72) Inventor: Yasunori Ando, Kyoto (JP)

(73) Assignee: NISSIN ELECTRIC CO., LTD., Kyoto (JP)

(*) Notice: Subject to any disclaimer, the term of this patent is extended or adjusted under 35 U.S.C. 154(b) by 0 days.

(21) Appl. No.: 14/324,039

(22) Filed: Jul. 3, 2014

(65) Prior Publication Data

US 2015/0017761 A1 Jan. 15, 2015

(30) Foreign Application Priority Data

Jul. 10, 2013 (JP) ................. 2013-144166

(51) Int. Cl.
*H01L 29/66* (2006.01)
*H01L 21/428* (2006.01)

(52) U.S. Cl.
CPC .................. *H01L 21/428* (2013.01)

(58) Field of Classification Search
CPC ............ H01L 21/428; H01L 21/1274
See application file for complete search history.

(56) References Cited

U.S. PATENT DOCUMENTS

2003/0160235 A1* 8/2003 Hirai ................. 257/40
2011/0198606 A1* 8/2011 Oda et al. ............ 257/72

FOREIGN PATENT DOCUMENTS

| JP | 2003-069030 | 3/2003 |
|---|---|---|
| JP | 2003-174153 | 6/2003 |
| JP | 2009-111125 | 5/2009 |
| JP | 2011-119355 | 6/2011 |
| JP | 2011129895 | 6/2011 |
| JP | 2011166009 | 8/2011 |
| JP | 2011-249788 | 12/2011 |
| JP | 2013-062553 | 4/2013 |

OTHER PUBLICATIONS

Nakata et al., "Novel Fabrication Method for Self-Aligned Bottom-Gate Oxide TFTs", IDW/AD'12, AMD4-4L (Late-News Paper), Dec. 2012, p. 431-p. 432.
Ohara et al., "Amorphous In—Ga—Zn—Oxide TFTs with Suppressed Variation for 4.0 inch QVGA AMOLED Display", AM-FPD'09 Digest, Jul. 2009, p. 227-230.
Ching-Wei Lin, et al., "A Novel Laser-Processed Self-Aligned Gate-Overlapped LDD Poly-Si TFT," IEEE Electron Device Letters, vol. 23, No. 3, Mar. 2002, pp. 133-135.

* cited by examiner

*Primary Examiner* — Alexander Ghyka
(74) *Attorney, Agent, or Firm* — Jianq Chyun IP Office

(57) ABSTRACT

A method for fabricating a thin-film transistor is described. A structure is provided, including a substrate transmitting an excimer laser light, a diffusion prevention film on the substrate, a gate electrode and a gate insulating film on the diffusion prevention film, and an oxide semiconductor layer on the gate insulating film. The structure is irradiated with an excimer laser light from the side of the substrate, so that two outer regions of the oxide semiconductor layer beside the region corresponding to the gate electrode are irradiated by the excimer laser light, with the gate electrode as a mask, to be reduced in resistance and thereby one of the two outer regions forms a source region and the other one forms a drain region. The diffusion prevention film includes a SiN:F film containing fluorine in a SiN film.

22 Claims, 8 Drawing Sheets

METHOD FOR FABRICATING THIN-FILM TRANSISTOR

CROSS-REFERENCE TO RELATED APPLICATION

This application claims priority benefits of Japan Patent Application No. 2013-144166 filed on Jul. 10, 2013. The entirety of the above-mentioned patent application is hereby incorporated by reference herein and made a part of this specification.

BACKGROUND OF THE INVENTION

1. Field of the Invention

The invention relates to a method for fabricating a thin-film transistor (TFT), and specifically relates to a method for fabricating a self-aligned TFT (more specifically, oxide semiconductor TFT) using a so-called self-alignment process that is performed by irradiating, with an excimer laser light and with the gate electrode as a mask, two outer regions of the oxide semiconductor layer beside a region corresponding to the gate so that the two outer regions are reduced in resistance to form source/drain regions.

2. Description of the Related Art

Non-patent Document 1 discloses an exemplary method for fabricating a self-aligned oxide semiconductor TFT using the self-alignment process as described above. The fabricating method is explained in brief with reference to FIG. 1.

A structure is provided, including a (glass) substrate 62, a gate electrode 64 having a predetermined pattern and a gate insulating film ($SiO_2$) 66 covering the gate electrode 64 on the substrate 62, and an oxide semiconductor layer (In—Ga—Zn—O) 68 formed on the gate insulating film 66. The structure is irradiated with an excimer laser light (XeCl, wavelength: 308 nm) 70 from the side of the substrate 62, so that two outsides (left and right sides) of the region of the oxide semiconductor layer 68 corresponding to the gate electrode 64 (see FIG. 1(A)) are irradiated by the excimer laser light 70, with the gate electrode 64 as a mask, to be reduced in resistance and thereby one of the two outside regions forms a source region 72 and the other one forms a drain region 73 (see FIG. 1(B)). That is, without being irradiated by the excimer laser light 70 the region of the oxide semiconductor layer 68 corresponding to the gate electrode 64 remains unchanged to become a channel region 74. The channel region 74 has the source region 72 and the drain region 73 formed at its two sides. In this way, a self-aligned oxide semiconductor TFT may be fabricated using the self-alignment process. In addition, on top of the source region 72 and the drain region 73, a source electrode 76 and a drain electrode 78 are respectively formed.

In the method for fabricating a TFT by this self-alignment process, as overlap between the source region 72, the drain region 73 and the gate electrode 64 is absent, the parasitic capacitance therebetween may be reduced. Also, since a stable structure may be produced, a TFT with good properties may be obtained, which is an advantage.

Patent Document 1 and Non-patent Document 2 below will be described later.

Patent Document 1: Japanese Unexamined Patent Application Publication No. 2003-69030 (paragraph 0022 and FIG. 1)

Non-Patent Document 1: Mitsuru Nakata, et al., IDW/AD '12 AMD4-4L (Late-News Paper), p. 431-432

Non-Patent Document 2: Hiroki Ohara, et al., AM-FPD '09 Digest, p. 227-230, 2009

Although not mentioned in Non-patent Document 1, as mentioned in Patent Document 1, between the substrate composed of glass or resin, etc. and the gate electrode, the gate insulating film and so on over the substrate for constituting the thin-film transistor, a diffusion prevention film for preventing diffusion of impurities (e.g., alkali metal such as sodium, etc.) from the substrate is usually disposed.

Compared with a silicon oxide ($SiO_2$) film, a silicon nitride (SiN) film is more often used as the diffusion prevention film, for having a higher film density (atomic density) and a finer structure to have a great effect of preventing diffusion of impurities. For example, the atomic density of the $SiO_2$ film is about 2.1 to 2.2 $g/cm^3$, and that of a later-described hydrogenated silicon nitride (SiN:H) film is about 2.4 to 2.8 $g/cm^3$.

A plasma CVD method using $SiH_4$ and $NH_3$ as source gas is commonly used for formation of the above SiN film. The SiN film formed by this method contains a large amount of hydrogen for burying the dangling bonds in the film, and is thus referred to as a hydrogenated silicon nitride (SiN:H) film.

However, a problem is known that when such hydrogenated SiN film is used as the diffusion prevention film in the method for fabricating a TFT by the aforementioned self-alignment process, the excimer laser light cannot be transmitted through the diffusion prevention film and is almost absorbed by the film.

FIG. 4 illustrates an example of a result of measuring light transmittance of various films formed on a glass substrate using a spectrophotometer. A film D is a hydrogenated SiN (SiN:H) film formed by the aforementioned plasma CVD method, and has a very small transmittance (but a very large absorptivity) in the wavelength range of ultraviolet rays. For example, the transmittance is about 2% in the wavelength of 308 nm of the XeCl excimer laser light.

Accordingly, even if intending to fabricate a TFT through the self-alignment process by using an excimer laser light to irradiate a structure having such hydrogenated SiN film as a diffusion prevention film, the emitted laser light may almost be absorbed by the diffusion prevention film and may hardly reach the oxide semiconductor layer. Consequently, not only the source/drain regions cannot be formed, but also problems such as damage to the diffusion prevention film, peeling-off of the film from the substrate, and even breakdown of transistor devices, etc. are caused due to an excessive temperature rise in the diffusion prevention film.

SUMMARY OF THE INVENTION

Accordingly, the invention provides a method for fabricating a TFT, which is capable of preventing an excessive temperature rise in the film constituting a TFT during irradiation with excimer laser light in the self-alignment process.

In the first method for fabricating a TFT of the invention, a structure is firstly provided, including a substrate transmitting an excimer laser light, a diffusion prevention film formed on the substrate for preventing diffusion of impurities from the substrate, a gate electrode and a gate insulating film covering the gate electrode that are formed on the diffusion prevention film, and an oxide semiconductor layer formed on the gate insulating film. The structure is irradiated with an excimer laser light from the side of the substrate, so that two outer regions of the oxide semiconductor layer beside the region corresponding to the gate electrode are irradiated by the excimer laser light, with the gate electrode as a mask, to be reduced in resistance and thereby one of the two outer regions forms a source region and the other one forms a drain region.

The method is characterized in that the diffusion prevention film comprises a fluorinated SiN film containing fluorine in a SiN film.

Since the fluorinated SiN film has a high transmittance to the excimer laser light, by constituting the diffusion prevention film with the fluorinated SiN film, the diffusion prevention film may be prevented from an excessive rise in temperature during irradiation with the excimer laser light in the self-alignment process.

Moreover, the fluorinated SiN film has a finer structure than a silicon oxide film, thus having a great effect of preventing diffusion of impurities from the substrate.

In addition, the gate insulating film may also include a fluorinated SiN film containing fluorine in a silicon nitride film.

In cases where the structure before being irradiated with the excimer laser light further has a protection film covering the oxide semiconductor layer, the protection film may also include a fluorinated SiN film containing fluorine in a SiN film.

In the second method for fabricating a TFT of the invention, a structure is provided, including a substrate transmitting an excimer laser light, a gate electrode and a gate insulating film covering the gate electrode that are formed on the substrate, and an oxide semiconductor layer formed on the gate insulating film. The structure is irradiated with an excimer laser light from the side of the substrate, so that two outer regions of the oxide semiconductor layer beside the region corresponding to the gate electrode are irradiated by the excimer laser light, with the gate electrode as a mask, to be reduced in resistance and thereby one of the outer regions forms a source region and the other forms a drain region. The method is characterized in that the gate insulating film includes a fluorinated SiN film containing fluorine in a SiN film.

In the third method for fabricating a TFT of the invention, a structure is provided, including a substrate, an oxide semiconductor layer formed on the substrate, a gate insulating film formed on the oxide semiconductor layer, and a gate electrode formed on the gate insulating film. The structure is irradiated with an excimer laser light from the side of the gate electrode, so that two outer regions of the oxide semiconductor layer beside the region corresponding to the gate electrode are irradiated by the excimer laser light, with the gate electrode as a mask, to be reduced in resistance and thereby one of the two outer regions forms a source region and the other one forms a drain region. The method is characterized in that the gate insulating film includes a fluorinated SiN film containing fluorine in a silicon nitride film.

The proportion of fluorine in the fluorinated SiN film is preferably 10 to 25 at %.

According to the first item of the invention, since the fluorinated SiN film has a high transmittance to the excimer laser light, by constituting the diffusion prevention film with the fluorinated SiN film, the diffusion prevention film may be prevented from an excessive rise in temperature during irradiation with the excimer laser light in the self-alignment process, so damage to the diffusion prevention film, peeling-off of the film from the substrate, and even breakdown of transistor devices, etc. may be avoided.

Moreover, the fluorinated SiN film has a finer structure than a silicon oxide film, thus having a great effect of preventing diffusion of impurities from the substrate.

According to the second item of the invention, the following effects are also achieved. Similar to the case of the diffusion prevention film, the gate insulating film also has a high light transmittance, and thus may be prevented from an excessive rise in temperature during irradiation with the excimer laser light in the self-alignment process.

Moreover, the fluorinated SiN film is capable of burying a dangling bond by the fluorine contained in the film, and thus may obtain stable insulation characteristics.

Moreover, since the gate insulating film and the diffusion prevention film are films of the same type, the same film forming process may be used for them. Thereby, the film forming process is simplified.

Further, compared to conventionally used silicon oxide films, in the fluorinated SiN film constituting the gate insulating film, compositional deviation in the elements constituting the film or a fixed charge caused by a small amount of impurities easily occur, and the transfer characteristics curve of the thin-film transistor is shifted to the positive side of the gate voltage, so it is possible to set the gate voltage at which the drain current rises, i.e., the threshold voltage, to the positive side. Hence, when operating the thin-film transistor, it is no longer necessary to apply thereto a voltage having positive and negative polarities as the gate voltage, so not only degradation of the TFT may be suppressed, but also the reliability thereof may be improved.

According to the third item of the invention, the following effects are further achieved. That is, even if a part of the excimer laser light in the self-alignment process passes through the gate insulating film to irradiate the protection film, since the protection film includes a fluorinated SiN film, the protection film also has a high light transmittance and may be prevented from an excessive rise in temperature during irradiation with the excimer laser light.

Moreover, since the protection film and the diffusion prevention film are films of the same type, the same film forming process may be used for them. Accordingly, the film forming process is simplified.

Furthermore, if a hydrogenated SiN film is used as the protection film, similar to the case of conventional diffusion prevention films, the hydrogen in the film diffuses and penetrates into the oxide semiconductor layer adjacent to the film and changes the characteristics of the TFT. Nonetheless, in the invention, the protection film includes a fluorinated SiN film. Since the Si—F bonding in the film is so strong that separation of fluorine and its diffusion into the oxide semiconductor layer are not easy, a TFT having good property stability may be obtained. Also, it is no longer necessary to specially dispose a film conventionally used for preventing diffusion and penetration of hydrogen (such film is also called an etching stopper), and thus the process may be simplified.

According to the fourth item of the invention, the following effects are further achieved. That is, by setting the proportion of fluorine in the fluorinated SiN film to 10 to 25 at %, the dangling bond in the film may be moderately buried by the fluorine, and since the fluorine is not excessive, deterioration of film properties, such as reduction in film density and reduction in insulation performance, may be prevented.

According to the fifth item of the invention, since the fluorinated SiN film constituting the gate insulating film has a finer structure than the conventionally used silicon oxide film, the fluorinated SiN film has a great effect of preventing the diffusion of impurities from the substrate. Accordingly, the gate insulating film may also function as a diffusion prevention film, so it is no longer necessary to separately dispose a diffusion prevention film. Thereby, the process may be simplified.

Further, similar to the above first and second items of the invention, the effects below may be achieved: a) that the gate insulating film has a high light transmittance and may be prevented from an excessive rise in temperature during irradiation with the excimer laser light, b) that the gate insulating film may be provided with stable insulation characteristics, and c) that the transfer characteristics curve of the TFT may be shifted to the positive side of the gate voltage due to a great charge-trapping effect caused by defects in the gate insulating film.

According to the sixth item of the invention, similar to the above third item of the invention, the following effects may be achieved: a) that the protection film has a high light transmittance and may be prevented from an excessive rise in temperature during irradiation with the excimer laser light, b) that the same film forming process may be used for both the protection film and the gate insulating film to simplify the film forming process, c) that it is difficult for the fluorine in the protection film to be separated and diffused into the oxide semiconductor layer and thus a TFT having good property stability may be obtained, and d) that it is no longer necessary to specially dispose a film for preventing diffusion and penetration of hydrogen into the oxide semiconductor layer.

According to the seventh item of the invention, similar to the above fourth item of the invention, the following effects may be achieved. The dangling bond in the film may be moderately buried by the fluorine, and since the fluorine is not excessive, deterioration of film properties, such as reduction in film density and reduction in insulation performance, may be prevented.

According to the eighth item of the invention, since the fluorinated SiN film has a high transmittance to the excimer laser light, by constituting the gate insulating film with the fluorinated SiN film, the gate insulating film may be prevented from an excessive rise in temperature during irradiation with the excimer laser light in the self-alignment process. As a result, damage to the gate insulating film, peeling-off of the film, and even breakdown of transistor devices, etc. may be prevented.

Furthermore, similar to the above second item of the invention, the following effects may be achieved: a) that the gate insulating film may be provided with stable insulation characteristics, and (b) that the transfer characteristics curve of the TFT may be shifted to the positive side of the gate voltage due to a great charge-trapping effect caused by defects in the gate insulating film.

According to the ninth item of the invention, the following effects are further achieved. That is, since the fluorinated SiN film has a high transmittance to the excimer laser light, by constituting the protection film with the fluorinated SiN film, during irradiation with the excimer laser light in the self-alignment process, even if the excimer laser light is transmitted through the protection film, the protection film may be prevented from an excessive rise in temperature. Thus, damage to the protection film, peeling-off of the film, and even breakdown of transistor devices, etc. may be avoided.

Moreover, since the protection film and the gate insulating film are films of the same type, the same film forming process may be used for them. Accordingly, the film forming process is simplified.

According to the tenth item of the invention, the following effects are further achieved. That is, even if a part of the excimer laser light in the self-alignment process passes through the gate insulating film to irradiate the diffusion prevention film, since the diffusion prevention film includes a fluorinated SiN film, the diffusion prevention film also has a high light transmittance, and thus may be prevented from an excessive rise in temperature during irradiation with the excimer laser light.

Further, the following effects similar to the above effects of the invention may be achieved: a) that the fluorinated SiN film has a finer structure than a silicon oxide film and thus has a great effect of preventing diffusion of impurities from the substrate, b) the same film forming process may be used for both the diffusion prevention film and the gate insulating film to simplify the film forming process, and c) that it is difficult for the fluorine in the diffusion prevention film to be separated and diffused into the oxide semiconductor layer and thus a TFT having good property stability may be obtained.

According to the eleventh item of the invention, similar to the above fourth item of the invention, the following effects may be further achieved. The dangling bond in the film may be moderately buried by the fluorine, and since the fluorine is not excessive, deterioration of film properties, such as reduction in film density and reduction in insulation performance, may be prevented.

In order to make the aforementioned and other objects, features and advantages of this invention comprehensible, a preferred embodiment accompanied with figures is described in detail below.

DESCRIPTION OF THE EMBODIMENTS (1) First Embodiment

Bottom Gate Structure 1

The first embodiment is directed to an example of a method for fabricating a TFT having a bottom gate structure, and is described with reference to FIGS. 2A to 2C and FIGS. 3A and 3B.

Figure 1A:
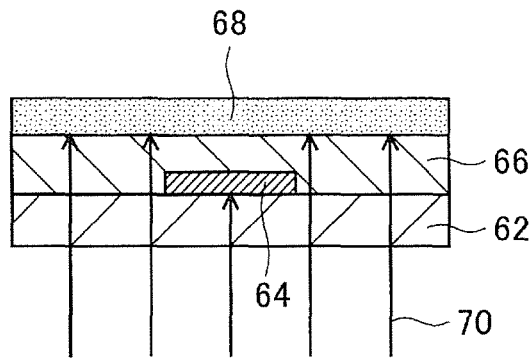
FIGS. 1A and 1B schematically illustrate an example of a method for fabricating a conventional TFT.
Figure 1B:
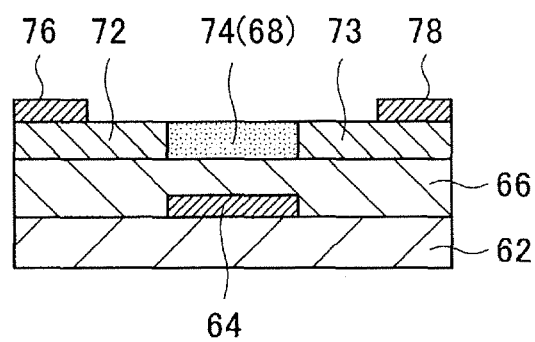
Figure 2A:
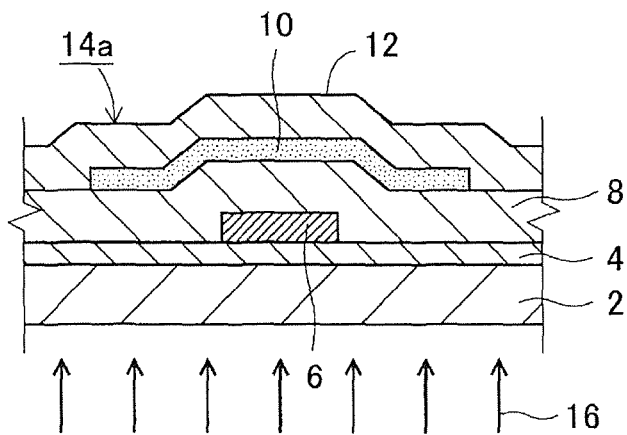
FIGS. 2A to 2C schematically illustrate a method for fabricating a TFT according to an embodiment of the invention.
Figure 2B:
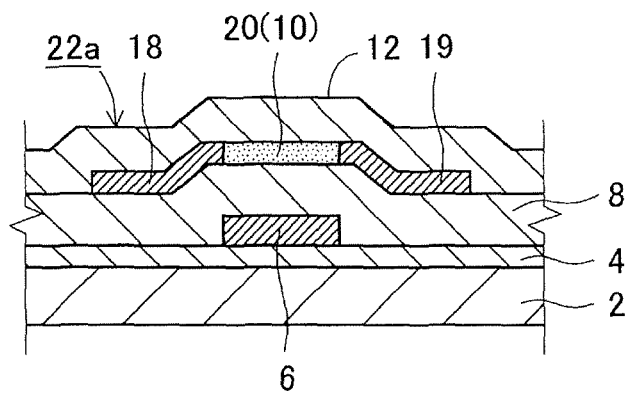

A structure 14a is provided, including a substrate 2 transmitting an excimer laser light 16, a diffusion prevention film 4 formed on the substrate 2 to prevent diffusion of impurities from the substrate 2 (i.e., substances contained in the substrate 2, e.g., alkali metal such as sodium, etc.), a gate electrode 6 with a predetermined pattern and a gate insulating film 8 covering the gate electrode 6 that are formed on the diffusion prevention film 4, and an oxide semiconductor layer 10 with a predetermined pattern formed on the gate insulating film 8 (see FIG. 2(A)).

Moreover, in this embodiment, although it is preferred that the structure 14a before being irradiated with the excimer laser light 16 further has a protection film 12 covering the oxide semiconductor layer 10 to better exhibit the protective effect to the structure 14a, when forming an essential transistor structure for the TFT, the protection film 12 is not necessary a required component. For example, the protection film 12 may be formed after the irradiation with the excimer laser light 16.

The substrate 2 is, for example, a glass substrate or a resin substrate, etc. for a display apparatus (display) and so on. In this embodiment, the substrate 2 transmits the excimer laser light 16.

The excimer laser light 16 is, for example, XeF excimer laser light ($\lambda$=351 nm), XeCl excimer laser light ($\lambda$=308 nm), or KrF excimer laser light ($\lambda$=248 nm), etc.

In this embodiment, the diffusion prevention film 4 includes a fluorinated SiN (abbreviated to SiN:F) film that is formed by containing fluorine in a SiN film.

The gate electrode 6 includes, for example, a metal, such as molybdenum, titanium, tantalum, tungsten, aluminum, copper, etc. or an alloy thereof. The gate electrode 6 prevents the excimer laser light 16 from being transmitted therethrough.

The gate insulating film 8 may include, for example, a conventionally used $SiO_2$ film. It may also include a SiN:F film containing fluorine in a SiN film, similar to the case of the diffusion prevention film 4. The gate insulating film 8 is electrically insulating and is configured to transmit the excimer laser light 16.

The oxide semiconductor layer 10 is, for example, an In—Ga—Zn—O (abbreviated to IGZO)-based metal oxide semiconductor layer, or alternatively an In—Sn—Zn—O-based metal oxide semiconductor layer or the like. Moreover, instead of being a ternary oxide semiconductor layer, it may alternatively be a quaternary or binary oxide semiconductor layer, and is not limited to a specific form.

The protection film 12 may include, for example, a conventionally used $SiO_2$ film. It may alternatively include a SiN:F film containing fluorine in a SiN film, similar to the case of the diffusion prevention film 4. The protection film 12 is configured to be electrically insulating.

The SiN:F film constituting the diffusion prevention film 4 and so on may be formed by, for example, a plasma CVD method using $SiF_4$ gas or $N_2$ gas as a source gas. Among plasma CVD methods, the inductively coupled plasma (ICP) CVD method that generates plasma by inductive coupling using the above source gas is preferred. The details thereof are explained later.

Figure 4:
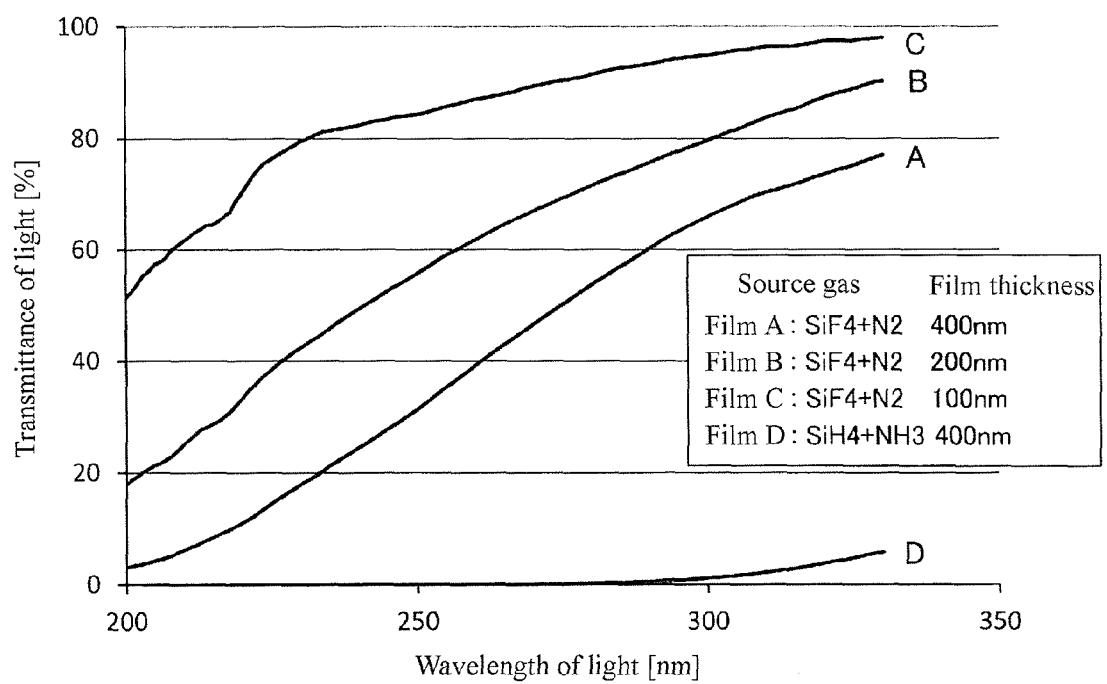
FIG. 4 illustrates an example of a result of measuring the light transmittance of various films formed on a glass substrate.

By the ICP-CVD method using the above source gas, the SiN:F film is formed on the glass substrate, and a result of measuring the light transmittance of this film using a spectrophotometer is exemplified in FIG. 4. The film A of 400 nm thick, the film B of 200 nm thick and the film C of 100 nm thick are SiN:F films as mentioned above. The film D is a conventional SiN:H film of 400 nm thick as mentioned above.

As shown in FIG. 4, all of the SiN:F films A, B and C have a very high transmittance in the wavelength range of the excimer laser light. The difference between them and the conventional film D is remarkable. For example, in the wavelength of 308 nm of the XeCl excimer laser light, the transmittances of the films A, B and C are approximately 70%, 83% and 96%, respectively.

Referring to FIGS. 2A-2C, 3A and 3B again, in the fabricating method according to the invention, the structure 14a is irradiated by the excimer laser light 16 from the side of the substrate 2 (FIGS. 2A and 3A), so that two outer regions 18 and 19 of the oxide semiconductor layer 10 beside the region corresponding to the gate electrode 6 are irradiated by the excimer laser light 16, with the gate electrode 6 as a mask, to be reduced in resistance and thereby one of the two outer regions 18 and 19 forms a source region 18 and the other forms a drain region 19 (FIGS. 2B and 3B). That is, without being irradiated by the excimer laser light 16, the region of the oxide semiconductor layer 10 corresponding to the gate electrode 6 remains unchanged to become a channel region 20, which has the source region 18 and the drain region 19 formed at its two sides. More specifically, the shape of the gate electrode 6 is transferred to the oxide semiconductor layer 10 to become a shaded region not irradiated by the excimer laser light 16, and the shaded region becomes the channel region 20. By irradiating the two outer regions beside the channel region 20, the resistance of the outer regions is reduced by excimer laser annealing to form the source region 18 and the drain region 19. In this way, by a self-alignment process, a self-aligned TFT (more specifically, self-aligned oxide semiconductor TFT; the same rule applies hereafter) 22a may be fabricated.

Figure 2C:
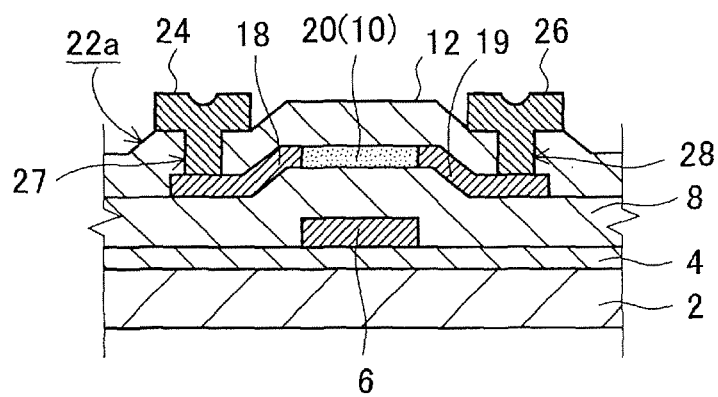
Figure 3A:
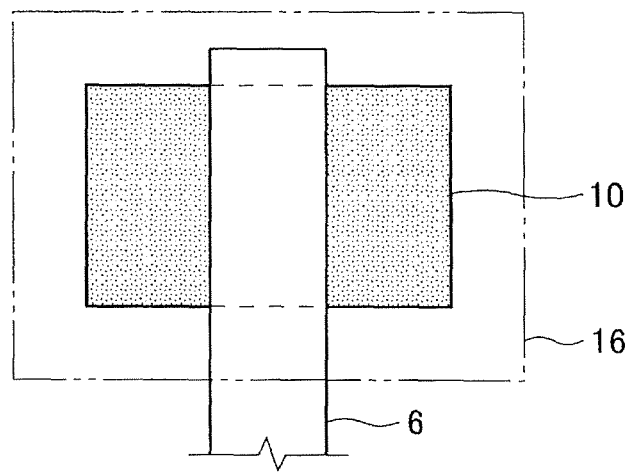
FIGS. 3A and 3B are respective bottom views of a gate electrode and an oxide semiconductor layer in FIGS. 2A and 2B as seen from the bottom.
Figure 3B:
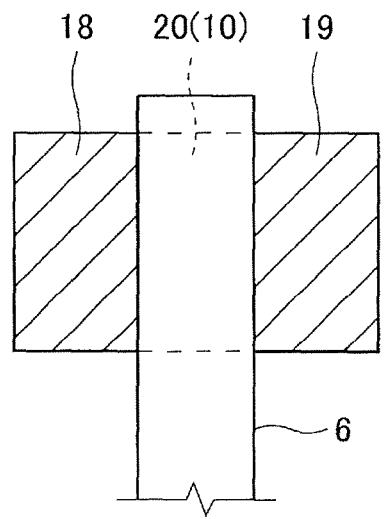

After that, if necessary, contact holes 27 and 28 are formed in the protection film 12. From above, a source electrode 24 and a drain electrode 26 respectively electrically connected with the source region 18 and the drain region 19 may be formed having a predetermined pattern (FIG. 2C).

In the method for fabricating a thin-film transistor using this self-alignment process, similar to the case of the aforementioned prior art, as the overlap between the source region 18, the drain region 19 and the gate electrode 6 is eliminated, the parasitic capacitance therebetween may be reduced. Moreover, since a stable structure may be produced, the TFT 22a having good properties may be obtained, which is an advantage. With respect to later-described other embodiments, the situation is the same.

Furthermore, according to the fabricating method of the first embodiment, the effects below are achieved. That is, since the SiN:F film has a high transmittance to the excimer laser light 16 as mentioned above, by constituting the diffusion prevention film 4 with the SiN:F film, it may be prevented from an excessive rise in temperature during irradiation with the excimer laser light 16 in the self-alignment process. Thus, damage to the diffusion prevention film 4, peeling-off of the film 4 from the substrate 2, and even breakdown of transistor devices, etc. may be prevented.

Moreover, the SiN:F film has a finer structure than a $SiO_2$ film, thus having a great effect of preventing diffusion of impurities from the substrate 2. For example, as mentioned above, the atomic density of the $SiO_2$ film is about 2.1 to 2.2 g/cm$^3$, and that of the SiN:H film is about 2.4 to 2.8 g/cm$^3$. By contrast, the atomic density of the SiN:F film is about 2.5 to 2.75 g/cm$^3$, which is almost equal to that of the SiN:H film.

In addition, the gate insulating film 8 may also include a SiN:F film. Accordingly, the following effects are achieved.

That is, similar to the case of the diffusion prevention film 4, such a gate insulating film 8 also has a high light transmittance, and thus may be prevented from an excessive rise in temperature during irradiation with the excimer laser light 16 in the self-alignment process.

Moreover, since dangling bonds have been buried by the fluorine contained in the SiN:F film, stable insulation characteristics can be obtained.

In addition, since the gate insulating film 8 and the diffusion prevention film 4 are films of the same type, the same film forming process may be used for both of them. Accordingly, the film forming process is simplified.

Figure 8:
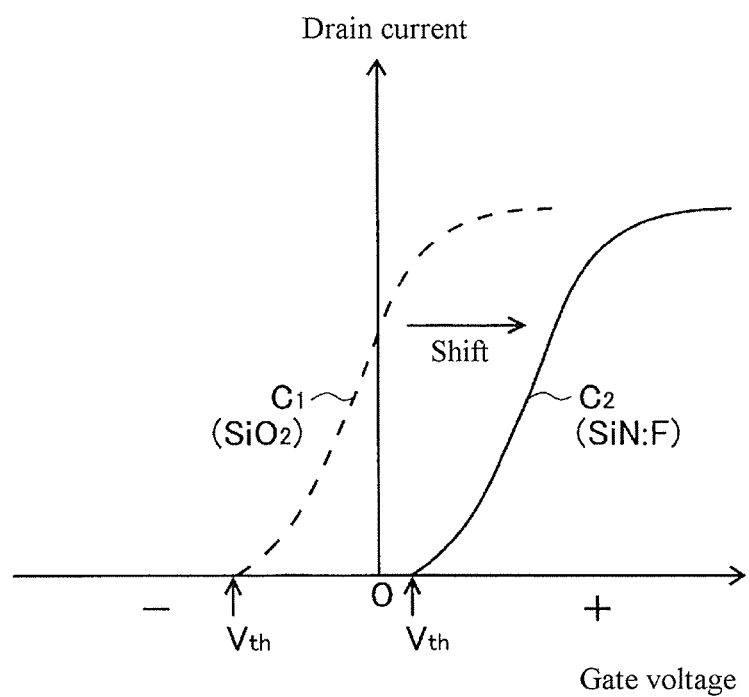
FIG. 8 schematically illustrates an example of the transfer characteristics of a TFT.

Further, compared to the conventionally used $SiO_2$ film, in the SiN:F film constituting the gate insulating film 8, compositional deviation in the elements constituting the film or a fixed charge caused by a small amount of impurities easily occur. Accordingly, for example, as shown in the example of FIG. 8, a transfer characteristics curve of the TFT is shifted to the positive side of the gate voltage (the curve C1 indicates the case of the SiO$_2$ film, while the curve C2 indicates the case of the SiN:F film), and it is possible to set the gate voltage at which the drain current rises, i.e., the threshold voltage ($V_{th}$), to the positive side. Hence, when operating the TFT, it is no longer necessary to apply thereto a voltage having positive and negative polarities as the gate voltage, so that not only degradation of the TFT may be suppressed, but also the reliability thereof may be improved.

Like the example shown in FIG. 2A, the structure 14a before being irradiated by the excimer laser light 16 may have the protection film 12 that include a SiN:F film. In this way, compared to the case where the protection film 12 includes the conventional SiN:H film, the following effects are achieved.

That is, even if a part of the excimer laser light 16 in the self-alignment process passes the gate insulating film 8 to irradiate the protection film 12, since the protection film 12 includes a SiN:F film, it also has a high light transmittance and can be prevented from an excessive rise in temperature during irradiation with the excimer laser light 16.

Moreover, since the protection film 12 and the diffusion prevention film 4 are films of the same type, the same film forming process may be used for both of them. Accordingly, the film forming process is simplified.

Further, if the conventional SiN:H film is used as the protection film 12, the hydrogen in the film may possibly diffuse and penetrate into the oxide semiconductor layer 10 adjacent to the film to change the characteristics of the TFT (specifically, to cause a shift of the $V_{th}$). Nonetheless, when the protection film 12 includes a SiN:F film, the Si—F bonding in the film is so strong that separation of fluorine and diffusion thereof into the oxide semiconductor layer 10 are not easy. Thus, the TFT 22a having good property stability (specifically, a reduced shift of the $V_{th}$) may be obtained. In addition, it is no longer necessary to specially dispose a film conventionally used for preventing the diffusion and penetration of hydrogen (such film is also referred to as an etching stopper and includes, e.g., alumina, etc.) and thus the process may be simplified.

In addition, as mentioned above, that the hydrogen in the protection film causes a $V_{th}$ shift of the oxide semiconductor TFT and has bad effects on the characteristics of the transistor is also mentioned in Non-patent Document 2 (e.g., left column of p. 229).

The proportion of fluorine in the SiN:F film constituting the diffusion prevention film 4, the gate insulating film 8 or the protection film 12 is preferably set to 10 to 25 at %. In this way, the dangling bonds in the film may be moderately buried by the fluorine, and since the fluorine is not excessive, deterioration of film properties, such as reduction in film density and reduction in insulation performance, may be prevented. With respect to the SiN:F film constituting the film in the later-described other embodiments, the situation is the same.

(2) ICP-CVD Method

Figure 7:
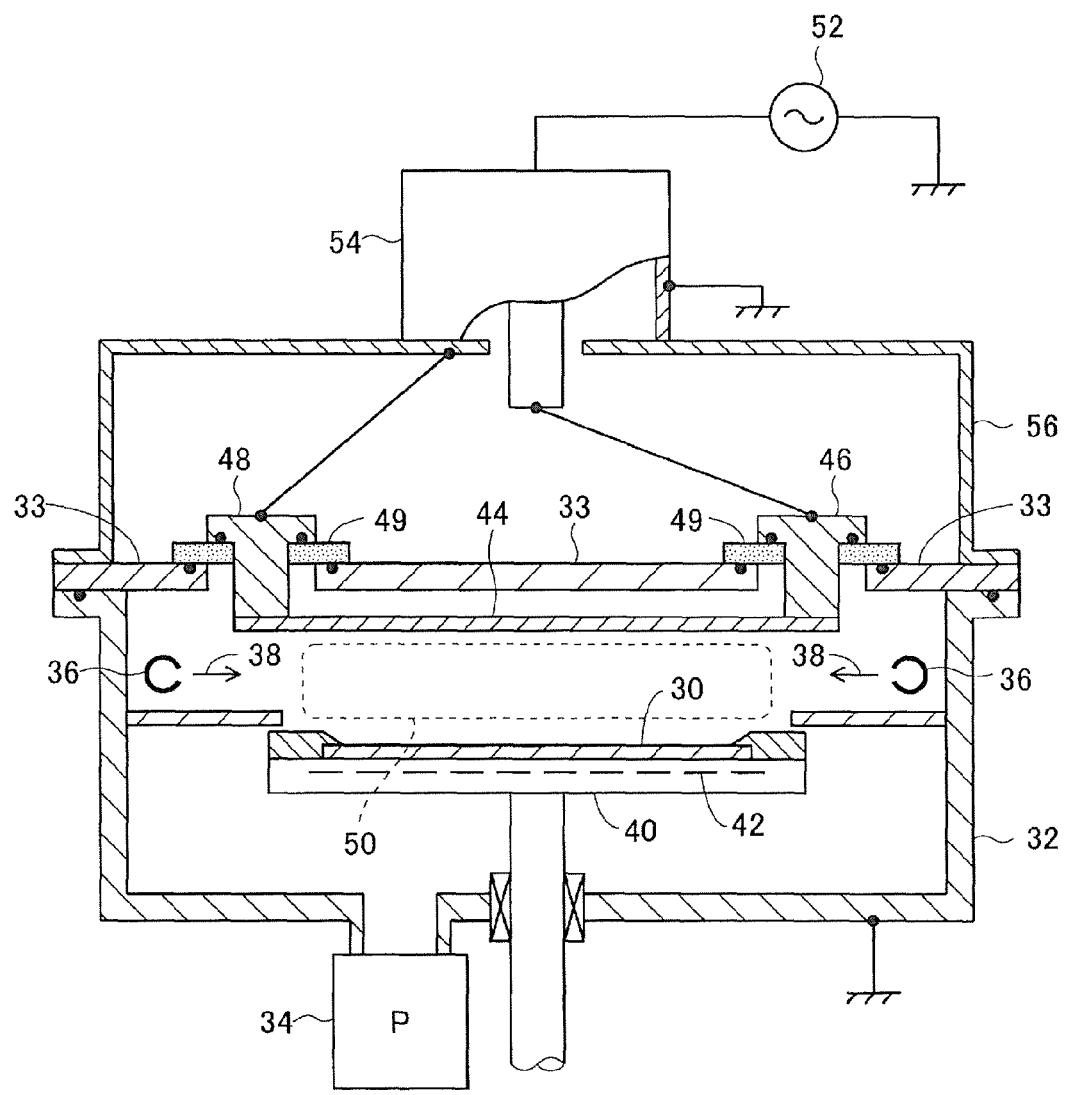
FIG. 7 illustrates, in a cross-sectional view, an example of an inductively coupled plasma CVD apparatus.

FIG. 7 illustrates an example of an ICP-CVD apparatus that forms a film on a substrate using the aforementioned ICP-CVD method.

The plasma CVD apparatus is an ICP-CVD apparatus that generates plasma 50 through an inductive field generated by flowing a high-frequency current from a high-frequency power source 52 to a planar conductor 44 and uses the plasma 50 to perform film formation on a substrate 30 by a plasma CVD method.

The substrate 30 is, for example, the substrate 2 that constitutes the above structure 14a (or later-described structures 14b and 14c), or is prepared by forming required films or electrodes on the substrate 2.

The plasma CVD apparatus includes, e.g., a vacuum container 32 made of a metal. A vacuum is formed inside the vacuum container 32 by a vacuum exhauster 34.

A source gas 38 corresponding to the processing to be applied to the substrate 30 is introduced into the vacuum container 32 through a gas introduction pipe 36. For example a mixed gas of SiF$_4$ and N$_2$ is introduced as the source gas 38 as above.

A holder 40 for holding the substrate 30 is disposed in the vacuum container 32. A heater 42 for heating the substrate 30 when necessary is disposed in the holder 40.

In the vacuum container 32, or more specifically, at an inner side of the ceiling plane 33 of the vacuum container 32, a planar conductor 44 having a rectangular planar shape is disposed opposite to the substrate holding face of the holder 40. The planar shape of the planar conductor 44 may be rectangular or square, etc. The planar shape may be determined specifically according to, e.g., the planar shape of the substrate 30.

High-frequency power is supplied between the power supply terminal and the end terminal, respectively at one side and the other side of the planar conductor 44 in a longitudinal direction, from the high-frequency power source 52 via a matching circuit 54, a power supply electrode 46 and a terminal electrode 48. Thus, a high-frequency current flows to the planar conductor 44. The frequency of the high-frequency power outputted from the high-frequency power source 52 is, for example, 13.56 MHz in a general case, but is not limited thereto.

The power supply electrode 46 and the terminal electrode 48 are respectively installed on the ceiling plane 33 of the vacuum container 32 through insulating flanges 49. Among these components, packing for vacuum sealing is respectively disposed. As shown in this example, it is preferred that the top of the ceiling plane 33 is covered by a shield box 56 for preventing high frequency leakage.

As mentioned above, by flowing the high-frequency current to the planar conductor 44, a high-frequency magnetic field is generated around the planar conductor 44, thereby generating an inductive field in a direction opposite to the high-frequency current. Due to the inductive field, in the vacuum container 32, electrons are accelerated and the gas 38 in proximity to the planar conductor 44 is ionized, and the plasma 50 is generated in proximity to the planar conductor 44. The plasma 50 is diffused to the proximity of the substrate 30. With the plasma 50, film formation may be performed on the substrate 30 by the plasma CVD method.

By the ICP-CVD method using the plasma CVD apparatus as described above, the diffusion prevention film 4, the gate insulating film 8 and the protection film 12, each of which includes a SiN:F film containing fluorine in a SiN film, may be formed on the substrate 2 or the like that constituting the structure 14a. With respect to the later-described structures 14b and 14c, the situation is the same.

Compared to SiH$_4$ and NH$_3$ that are conventionally often used, SiF$_4$ gas and N$_2$ gas are difficult to discharge and decompose. Nonetheless, according to the above ICP-CVD method, a large inductive field can be generated in the plasma 50, so the SiF$_4$ gas and N$_2$ gas may be efficiently discharged and decomposed. Thus, a high-density plasma 50 is generated, and the SiN:F film may be efficiently formed.

Next, the other embodiments of the method for fabricating a TFT are described. Parts identical or equivalent to those in the above first embodiment are denoted by identical reference numerals. The difference from the first embodiment are described.

(3) Second Embodiment

Bottom Gate Structure 2

Figure 5A:
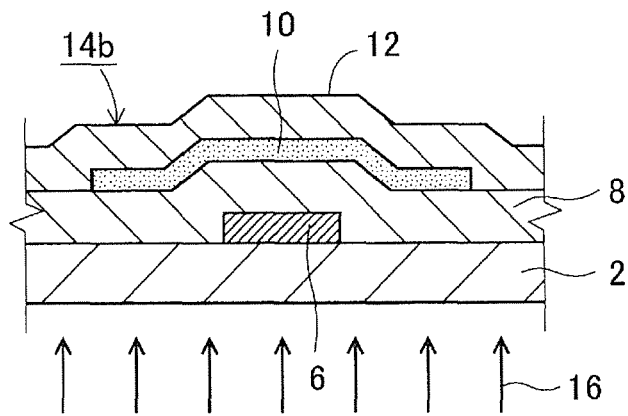
FIGS. 5A to 5C schematically illustrate the method for fabricating a TFT according to another embodiment of the invention.
Figure 5B:
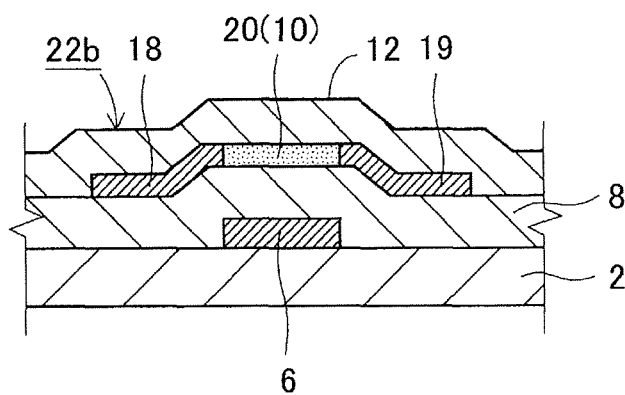
Figure 5C:
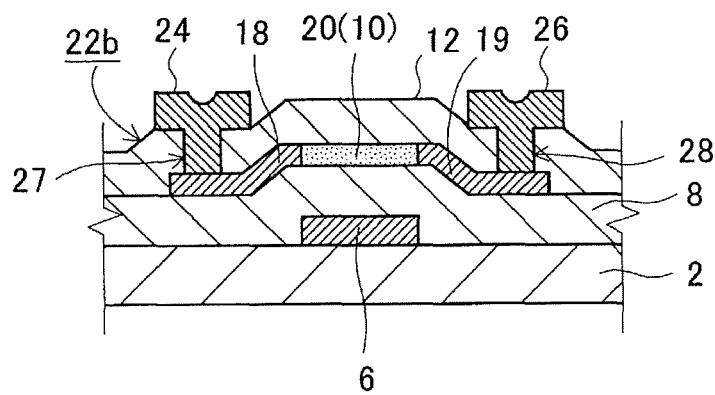

The second embodiment is directed to another example of the method for forming a TFT having a bottom gate structure, and is described referring to FIG. 5A to 5C.

In this embodiment, the structure 14b does not have the above diffusion prevention film 4, and is provided including a substrate 2 transmitting the excimer laser light 16, a gate electrode 6 having a predetermined pattern and a gate insulating film 8 covering the gate electrode 6 formed on the substrate 2, and an oxide semiconductor layer 10 having a predetermined pattern formed on the gate insulating film 8 (FIG. 5A).

In this embodiment, the gate insulating film 8 includes a SiN:F film containing fluorine in a SiN film as described above.

Whether or not the protection film 12 is formed in the structure 14b before the irradiation with the excimer laser light 16 is as mentioned above.

Also, in this embodiment, the structure 14b is irradiated with the excimer laser light 16 from the side of the substrate 2, so that the two outer regions 18 and 19 of the oxide semiconductor layer 10 beside the region corresponding to the gate electrode 6 are irradiated by the excimer laser light 16, with the gate electrode 64 as a mask, to be reduced in resistance and thereby one of the two outer regions 18 and 19 forms a source region 18 and the other forms a drain region 19 (FIG. 5B). That is, without being irradiated by the excimer laser light 16, the region of the oxide semiconductor layer 10 corresponding to the gate electrode 6 remains unchanged to become the channel region 20, which has the source region 18 and the drain region 19 formed at its two sides. In this way, by the self-alignment process, a self-aligned TFT (more specifically, self-aligned oxide semiconductor TFT) 22b may be fabricated.

A source electrode 24 and a drain electrode 26 may be formed subsequently (see FIG. 5C), as described above.

According to the fabricating method of the second embodiment, the following effects are achieved. That is, as mentioned above, since the SiN:F film constituting the gate insulating film 8 has a finer structure than the conventionally used SiO$_2$ film, the SiN:F film has a great effect of preventing diffusion of impurities from the substrate 2. Accordingly, the gate insulating film 8 may also function as a diffusion prevention film, so it is no longer necessary to separately dispose a diffusion prevention film, and thus the process is simplified. The fabricating cost of the transistor may also be reduced.

Further, similar to the case of the above first embodiment, the effects below may be achieved: a) that the gate insulating film 8 has a high light transmittance and may be prevented from excessive rise in temperature during irradiation by the excimer laser light 16, b) the the gate insulating film 8 may be provided with stable insulation characteristics, and c) the transfer characteristics curve of the TFT may be shifted to the positive side of the gate voltage due to the fixed charge in the gate insulating film 8.

Like the example shown in FIG. 5A, the structure 14b before being irradiated with the excimer laser light 16 may have a protection film 12 including a SiN:F film. In this way, similar to the case of the first embodiment, the following effects may be achieved: a) that the protection film 12 has a high light transmittance and may be prevented from an excessive rise in temperature during irradiation by the excimer laser light 16, b) that the same film forming process may be used for both of the protection film 12 and the gate insulating film 8 to simplify the film forming process, c) that it is not easy for the fluorine in the protection film 12 to be separated and diffused into the oxide semiconductor layer 10 and thus a TFT having good property stability may be obtained, and d) that it is no longer necessary to specially dispose a film for preventing diffusion and infiltration of hydrogen into the oxide semiconductor layer 10.

(4) Third Embodiment

Top Gate Structure

The third embodiment is directed to an example of a method for fabricating a TFT having a top gate structure, and is described with reference to FIGS. 6A to 6C.

Figure 6A:
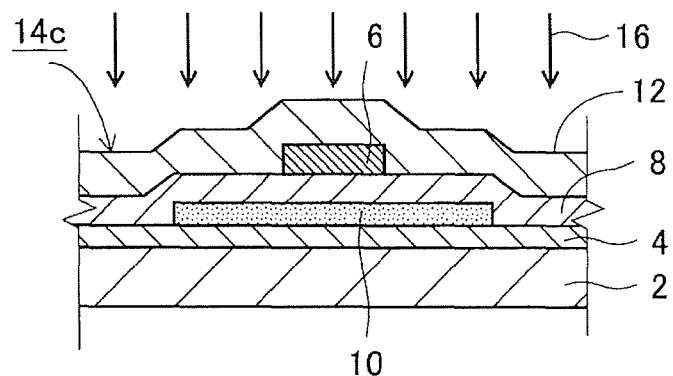
FIGS. 6A to 6C schematically illustrate the method for fabricating a TFT according to still another embodiment of the invention.

In this embodiment, the structure 14c is provided including a substrate 2, an oxide semiconductor layer 10 with a predetermined pattern formed on the substrate 2, a gate insulating film 8 formed on the oxide semiconductor layer 10, and a gate electrode 6 having a predetermined pattern formed on the gate insulating film 8 (FIG. 6A).

In this embodiment, the gate insulating film 8 includes a SiN:F film containing fluorine in a SiN film as described above.

Moreover, in this embodiment, since the irradiation by excimer laser light 16 is from the side of the gate electrode 6 instead of the substrate 2, in the self-alignment process, the substrate 2 does not necessarily transmit the excimer laser light 16.

In addition, as in this embodiment, the structure 14c before being irradiated with the excimer laser light 16 may have the protection film 12 that covers the gate electrode 6 and the gate insulating film 8 (FIG. 6A). In that case, the protection film 12 preferably includes an aforementioned SiN:F film containing fluorine in a SiN film.

In addition, the structure 14c before being irradiated with the excimer laser light 16 may also have the diffusion prevention film 4 formed between the substrate 2 and the oxide semiconductor layer 10 for preventing diffusion of impurities from the substrate 2 (FIG. 6A). In that case, the diffusion prevention film 4 preferably includes an aforementioned SiN:F film containing fluorine in a SiN film.

Figure 6B:
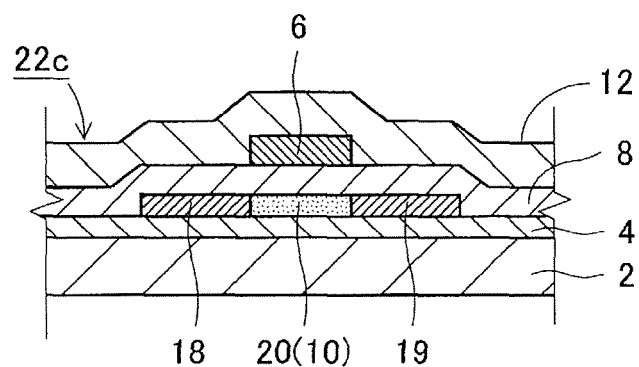
Figure 6C:
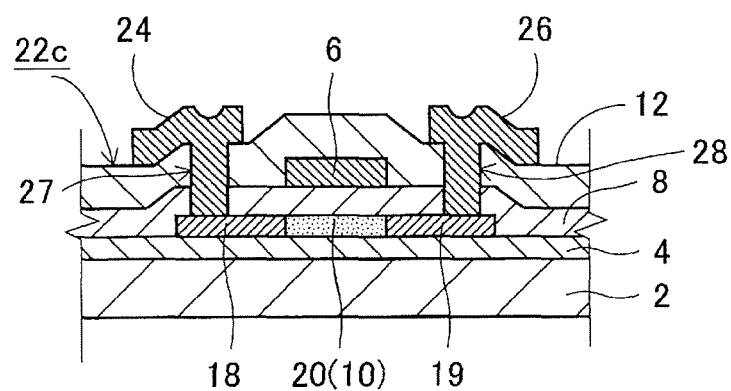

In this embodiment, the structure 14c is irradiated by the excimer laser light 16 from the side of the gate electrode 6, so that two outer regions 18 and 19 of the oxide semiconductor layer 10 beside the region corresponding to the gate electrode 6 are irradiated by the excimer laser light 16, with the gate electrode 6 as a mask, to be reduced in resistance and thereby one of the two outer regions 18 and 19 forms a source region 18 and the other forms a drain region 19 (FIG. 6B). That is, without being irradiated by the excimer laser light 16, the region of the oxide semiconductor layer 10 corresponding to the gate electrode 6 remains unchanged to become the channel region 20, which has the source region 18 and the drain region 19 formed at its two sides. In this way, by the self-alignment process, a self-aligned TFT (more specifically, self-aligned oxide semiconductor TFT) 22c may be fabricated.

A source electrode 24 and a drain electrode 26 may be formed subsequently (FIG. 6C), as described above.

According to the fabricating method of the third embodiment, the following effects are achieved. That is, since the fluorinated SiN film has a high transmittance to the excimer laser light 16 as mentioned above, by constituting the gate insulating film 8 with a SiN:F film, the gate insulating film 8 may be prevented from an excessive rise in temperature during irradiation with the excimer laser light 16 in the self-alignment process. As a result, damage to the gate insulating film 8, peeling-off of the film 8, and even breakdown of transistor devices, etc. may be prevented.

Further, similar to the case of the above first embodiment, the following effects may be made: a) that the gate insulating film 8 can be provided with stable insulation characteristics, and b) that the transfer characteristics curve of the TFT may be shifted to the positive side of the gate voltage due to the fixed charge in the gate insulating film 8.

In addition, in cases where the structure 14c before being irradiated with the excimer laser light 16 has a protection film 12, by constituting the protection film 12 with a SiN:F film, the following effects are achieved.

That is, since the SiN:F film has a high transmittance to the excimer laser light 16 as mentioned above, by constituting the protection film 12 with the SiN:F film, the protection film 12 may be prevented from an excessive rise in temperature during irradiation with the excimer laser light 16 in the self-alignment process even if the excimer laser light 16 passes through the protection film 12. Thus, damage to the protection film 12, peeling-off of the film 12, and even breakdown of transistor devices, etc. may be prevented.

Moreover, since the protection film 12 and the gate insulating film 8 are films of the same type, the same film forming process may be used for both of them. Accordingly, the film forming process is simplified.

In addition, in cases where the structure 14c before being irradiated with the excimer laser light 16 has a diffusion prevention film 4, by constituting the diffusion prevention film 4 with a SiN:F film, the following effects are achieved.

That is, even if a part of the excimer laser light 16 in the self-alignment process passes through the gate insulating film 8 to irradiate the diffusion prevention film 4, since the diffusion prevention film 4 includes a SiN:F film, the diffusion prevention film 4 also has a high light transmittance, and thus may be prevented from an excessive rise in temperature during irradiation with the excimer laser light 16.

Furthermore, similar to the above first embodiment, the following effects may be achieved: a) that the SiN:F film has a finer structure than a $SiO_2$ film and thus has a great effect of preventing diffusion of impurities from the substrate 2, b) that the same film forming process may be used for both of the diffusion prevention film 4 and the gate insulating film 8 to simplify the film forming process, and c) that it is not easy for the fluorine in the diffusion prevention film 4 to be separated and diffused into the oxide semiconductor layer 10 and thus a TFT having good property stability may be obtained.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating a thin-film transistor, comprising:
    providing a structure that comprises:
        a substrate transmitting an excimer laser light;
        a diffusion prevention film formed on the substrate, preventing diffusion of impurities from the substrate;
        a gate electrode and a gate insulating film covering the gate electrode, formed on the diffusion prevention film; and
        an oxide semiconductor layer formed on the gate insulating film, wherein
        the diffusion prevention film comprises a fluorinated silicon nitride film containing fluorine in a silicon nitride film; and
    irradiating, with an excimer laser light, the structure from the side of the substrate, so that two outer regions of the oxide semiconductor layer beside a region corresponding to the gate electrode are irradiated by the excimer laser light, with the gate electrode as a mask, to be reduced in resistance and thereby one of the two outer regions forms a source region and the other one forms a drain region.

2. The method of claim 1, wherein the gate insulating film comprises a fluorinated silicon nitride film containing fluorine in a silicon nitride film.

3. The method of claim 1, wherein the structure before being irradiated with the excimer laser light further has a protection film covering the oxide semiconductor layer, and the protection film comprises a fluorinated silicon nitride film containing fluorine in a silicon nitride film.

4. The method of claim 2, wherein the structure before being irradiated with the excimer laser light further has a protection film covering the oxide semiconductor layer, and the protection film comprises a fluorinated silicon nitride film containing fluorine in a silicon nitride film.

5. The method of claim 1, wherein a proportion of fluorine in the fluorinated silicon nitride film ranges from 10 at % to 25 at %.

6. The method of claim 2, wherein a proportion of fluorine in the fluorinated silicon nitride film ranges from 10 at % to 25 at %.

7. The method of claim 3, wherein a proportion of fluorine in the fluorinated silicon nitride film ranges from 10 at % to 25 at %.

8. The method of claim 4, wherein a proportion of fluorine in the fluorinated silicon nitride film ranges from 10 at % to 25 at %.

9. A method for fabricating a thin-film transistor, comprising:
    providing a structure that comprises:
        a substrate transmitting an excimer laser light;
        a gate electrode and a gate insulating film covering the gate electrode, formed on the substrate; and
        an oxide semiconductor layer formed on the gate insulating film, wherein
        the gate insulating film comprises a fluorinated silicon nitride film containing fluorine in a silicon nitride film; and
    irradiating, with an excimer laser light, the structure from the side of the substrate, so that two outer regions of the oxide semiconductor layer beside a region corresponding to the gate electrode are irradiated by the excimer laser light, with the gate electrode as a mask, to be reduced in resistance and thereby one of the two outer regions forms a source region and the other one forms a drain region.

10. The method of claim 9, wherein the structure before being irradiated with the excimer laser light further has a protection film covering on the oxide semiconductor layer, and the protection film is composed of a fluorinated silicon nitride film containing fluorine in a silicon nitride film.

11. The method of claim 9, wherein a proportion of fluorine in the fluorinated silicon nitride film ranges from 10 at % to 25 at %.

12. The method of claim 10, wherein a proportion of fluorine in the fluorinated silicon nitride film ranges from 10 at % to 25 at %.

13. A method for fabricating a thin-film transistor, comprising:
providing a structure that comprises:
a substrate;
an oxide semiconductor layer formed on the substrate;
a gate insulating film formed on the oxide semiconductor layer; and
a gate electrode formed on the gate insulating film, wherein
the gate insulating film comprises a fluorinated silicon nitride film containing fluorine in a silicon nitride film; and
irradiating, with an excimer laser light, the structure from the side of the gate electrode, so that two outer regions of the oxide semiconductor layer beside a region corresponding to the gate electrode are irradiated by the excimer laser light, with the gate electrode as a mask, to be reduced in resistance and thereby one of the two outer regions forms a source region and the other one forms a drain region.

14. The method of claim 13, wherein the structure before being irradiated by the excimer laser light further has a protection film covering the gate electrode and the gate insulating film, and the protection film comprises a fluorinated silicon nitride film containing fluorine in a silicon nitride film.

15. The method of claim 13, wherein the structure before being irradiated by the excimer laser light further has a diffusion prevention film formed between the substrate and the oxide semiconductor layer for preventing diffusion of impurities from the substrate, and the diffusion prevention film comprises a fluorinated silicon nitride film containing fluorine in a silicon nitride film.

16. The method of claim 14, wherein the structure before being irradiated by the excimer laser light further has a diffusion prevention film formed between the substrate and the oxide semiconductor layer for preventing diffusion of impurities from the substrate, and the diffusion prevention film comprises a fluorinated silicon nitride film containing fluorine in a silicon nitride film.

17. The method of claim 13, wherein a proportion of fluorine in the fluorinated silicon nitride film is 10 to 25 at %.

18. The method of claim 14, wherein a proportion of fluorine in the fluorinated silicon nitride film is 10 to 25 at %.

19. The method of claim 15, wherein a proportion of fluorine in the fluorinated silicon nitride film is 10 to 25 at %.

20. The method of claim 16, wherein a proportion of fluorine in the fluorinated silicon nitride film is 10 to 25 at %.

21. The method of claim 1, wherein the fluorinated silicon nitride film is formed with an inductively coupled plasma (ICP) CVD method.

22. The method of claim 9, wherein the fluorinated silicon nitride film is formed with an inductively coupled plasma (ICP) CVD method.

* * * * *